US008232659B2

(12) United States Patent
Chen et al.

(10) Patent No.: US 8,232,659 B2
(45) Date of Patent: Jul. 31, 2012

(54) THREE DIMENSIONAL IC DEVICE AND ALIGNMENT METHODS OF IC DEVICE SUBSTRATES

(75) Inventors: Hsueh-Chung Chen, Taipei (TW); Chine-Gie Lou, Hsinchu (TW); Su-Chen Fan, Tao-Yuan (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 1056 days.

(21) Appl. No.: 12/048,015

(22) Filed: Mar. 13, 2008

(65) Prior Publication Data

US 2008/0157407 A1 Jul. 3, 2008

Related U.S. Application Data

(62) Division of application No. 11/174,511, filed on Jul. 6, 2005, now Pat. No. 7,371,663.

(51) Int. Cl.
*H01L 23/544* (2006.01)
*H01L 23/34* (2006.01)

(52) U.S. Cl. ................. 257/797; 257/723; 257/E23.179

(58) Field of Classification Search .................. 257/797, 257/723, E23.179
See application file for complete search history.

(56) References Cited

U.S. PATENT DOCUMENTS 4,952,060 A 8/1990 Ina et al.
5,587,090 A 12/1996 Belcher et al.
5,821,549 A 10/1998 Talbot et al.
5,929,997 A 7/1999 Lin
6,087,719 A * 7/2000 Tsunashima ................. 257/686
6,309,943 B1 10/2001 Glenn et al.
6,376,329 B1 4/2002 Sogard et al.
6,476,499 B1 * 11/2002 Hikita et al. ................. 257/777
6,525,805 B2 2/2003 Heinle
6,564,986 B1 5/2003 Hsieh
6,617,702 B2 9/2003 Hsu et al.
6,809,421 B1 * 10/2004 Hayasaka et al. ............. 257/777
6,838,689 B1 * 1/2005 Deng et al. ................. 250/559.3
7,122,912 B2 * 10/2006 Matsui .......................... 257/797
7,192,845 B2 * 3/2007 Yen et al. ...................... 438/462
7,349,140 B2 * 3/2008 Yang ............................ 359/254
7,390,723 B2 * 6/2008 Chen ............................ 438/401
7,453,160 B2 * 11/2008 Ray .............................. 257/797
7,642,645 B2 * 1/2010 Daniel et al. .................. 257/723

FOREIGN PATENT DOCUMENTS

TW 353229 B 8/1997

* cited by examiner

*Primary Examiner* — Nitin Parekh
(74) *Attorney, Agent, or Firm* — Muncy, Geissler, Olds & Lowe, PLLC

(57) ABSTRACT

Alignment methods of IC device substrates. A first IC device substrate has a first front side for defining a plurality of first IC features, a first backside opposite the first front side, and a first alignment pattern formed on the first front side or the first backside. A second IC device substrate has a second front side for defining a plurality of second IC features, a second backside opposite the second front side, and a second alignment pattern formed on the second front side or the second backside. A first optical detector and a second optical detector are applied to detect the first and second alignment patterns, so as to align the first and second IC device substrates. Specifically, the first and second alignment patterns face toward the first and second optical detectors in opposite directions.

9 Claims, 7 Drawing Sheets

P1
P
H1
M1
N1
N1
WB1
W1
WF1
T
N2
N1
PROCESSOR
WF2
W2
M2'
N2
WB2
N2
M2
M2
P2

THREE DIMENSIONAL IC DEVICE AND ALIGNMENT METHODS OF IC DEVICE SUBSTRATES

This application is a Divisional of co-pending application Ser. No. 11/174,511, filed on Jul. 6, 2005, and for which priority is claimed under 35 USC §120, the entire contents of all are hereby incorporated by reference.

BACKGROUND OF THE INVENTION

1. Field of the Invention

The invention relates in general to IC device substrates alignment and in particular to semiconductor substrates with alignment structures for three dimensional IC fabrication.

2. Brief Discussion of the Related Art

The conventional process to align an IC device substrate is practiced by forming several alignment patterns on the front side of the substrate. Here, a semiconductor wafer W, as shown in FIG. 1*a*, is used as an example. The semiconductor wafer W comprises a silicon substrate S on its backside WB. An interconnection structure C is formed on the front side WF of the semiconductor wafer W for defining a plurality of IC features. Several alignment patterns M, such as cross patterns, are generally formed on the front side WF for alignment. In some specific fabrication processes, such as metallization or damascene processes, however, the alignment patterns M may be difficult to detect from the backside WB due to obstruction of opaque metallic material in the interconnection structure C. Additional processes for removing a part of the opaque material can be involved thereby improving visibility of the alignment patterns M, however, fabrication costs may potentially increase.

To detect and recognize the alignment patterns M from the backside WB when obstructed by opaque material, as shown in FIG. 1*a*, a traditional IR imaging apparatus D is applied. The IR imaging apparatus D can capture an image of each alignment pattern M from the backside WB for aligning the wafer W during processes, however, the accuracy and resolution are adversely limited due to IR wavelength substantially longer than 0.75 um. A resolution better than 0.1 um is usually required for the modern semiconductor process, such as the 90 nm technology and beyond.

In three dimensional IC fabrications, such as MEMs and SOI devices, two or more substrates W1 and W2 are bonded and aligned by alignment patterns M as shown in FIG. 1*b*. The front sides WF1 and WF2 of the substrates W1 and W2 are bonded face to face. Both front sides WF1 and WF2 define a plurality of IC features and comprise alignment patterns M thereon. It may be difficult, however, to detect the alignment patterns M from the backsides WB1 and WB2 of the two substrates W1 and W2 by IR detection during bonding. Hence, conventional wafer alignment is not convenient for three dimensional IC fabrications, and the accuracy can be adversely limited due to IR wavelength when opaque material obstructs the alignment patterns M on the front sides WF1 and WF2 of the substrates W1 and W2.

SUMMARY OF THE INVENTION

Three dimensional IC device and alignment methods of IC device substrates are provided. An exemplary embodiment of a first IC device substrate has a first front side for defining a plurality of first IC features, a first backside opposite the first front side, and a first alignment pattern formed on the first front side or the first backside. A second IC device substrate has a second front side for defining a plurality of second IC features, a second backside opposite the second front side, and a second alignment pattern formed on the second front side or the second backside. A first optical detector and a second optical detector are applied to detect the first and second alignment patterns, so as to align the first and second IC device substrates. Specifically, the first and second alignment patterns face toward the first and second optical detectors in opposite directions. The first and second optical detectors transmit position information of the first and second alignment patterns to a processor. Subsequently, the processor outputting an adjustment signal to control the movement of the IC device substrates, and the first and second IC device substrates are aligned with each other precisely according to the required accuracy.

An embodiment of a three dimensional IC device comprises a first IC device substrate and a second IC device substrate. The first IC device substrate comprises a first front side defining a plurality of first IC features, a first backside opposite the first front side, and a first alignment pattern formed on the first backside or the first front side. The second IC device substrate comprises a second front side for defining a plurality of second IC features, a second backside opposite the second front side, and a second alignment pattern formed on the second backside or the second front side. The first and second alignment patterns face outward with respect to the three dimensional IC device for alignment.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1A:
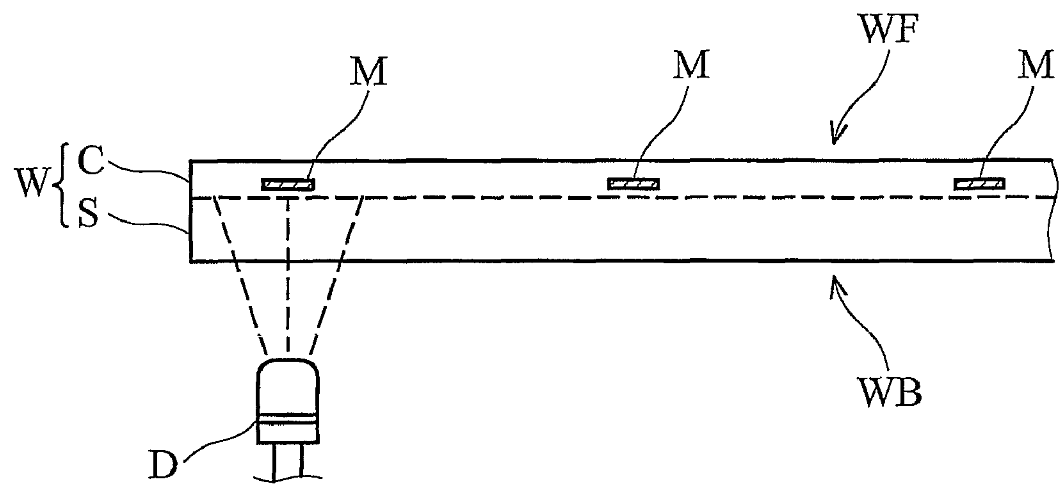
FIG. 1*a* is a perspective diagram of a conventional IC alignment with alignment patterns.
Figure 1B:
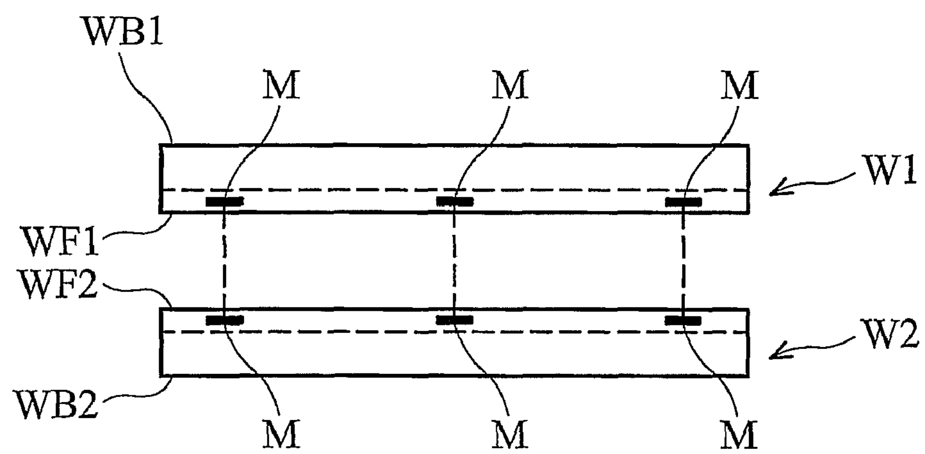
FIG. 1*b* is a perspective diagram of a conventional three dimensional IC constructed by bonding two IC device substrates with alignment patterns.
Figure 2A:
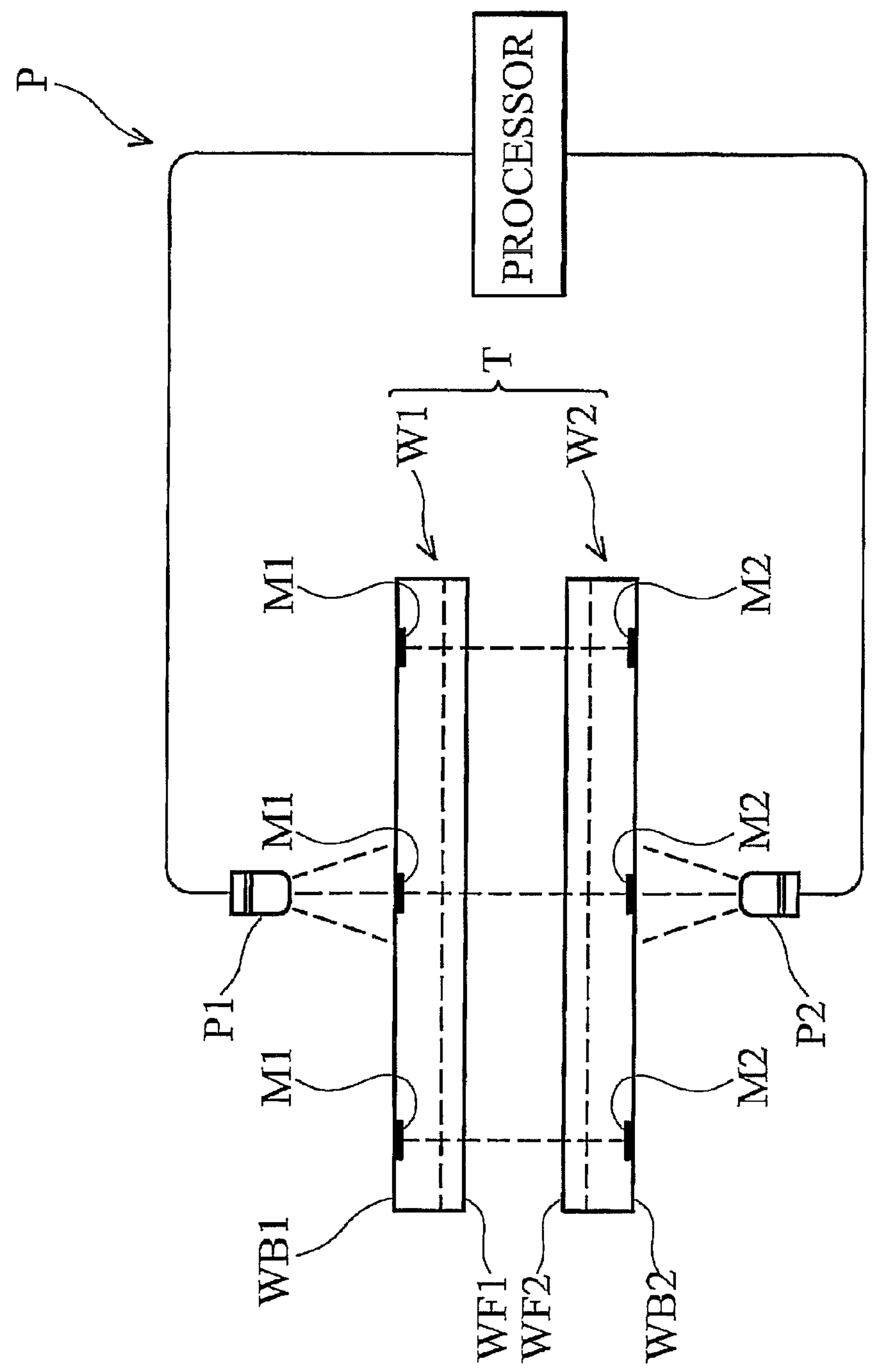
FIG. 2A is a perspective diagram in an embodiment of a three dimensional IC device with alignment patterns.

An embodiment of a three dimensional IC device with alignment patterns is illustrated in FIG. 2A. The three dimensional IC device T is fabricated by bonding a first IC device substrate W1 with a second IC device substrate W2 face to face, such as bonding two semiconductor wafers with IC device fabricated thereon. The first IC device substrate W1 comprises a first front side WF1 for defining a plurality of IC features and a first backside WB1 opposite to the first front side WF1. Similarly, the second IC device substrate W2 comprises a second front side WF2 for defining a plurality of IC features and a second backside WB2 opposite to the second front side WF2.

In FIG. 2A, several first alignment patterns M1 are formed on the first backside WB1, and several second alignment patterns M2 are formed on the second backside WB2 for alignment. An optical detector system P is provided for detecting the positions of the first and second alignment patterns M1 and M2. The optical detector system P comprises a processor and optical detectors P1 and P2 to detect the alignment patterns M1 and M2 from the first and second backsides WB1 and WB2, respectively. The optical detectors P1 and P2 transmit position information of alignment patterns M1 and M2 to the processor, and the optical detector system P subsequently outputs an adjustment signal to a moving stage (not shown), thereby appropriately adjusting the positions of the IC device substrates W1 and W2. According to the adjustment signal, the first and second IC device substrates W1 and W2 thus can be precisely aligned with each other during the bonding process.

Figure 2B:
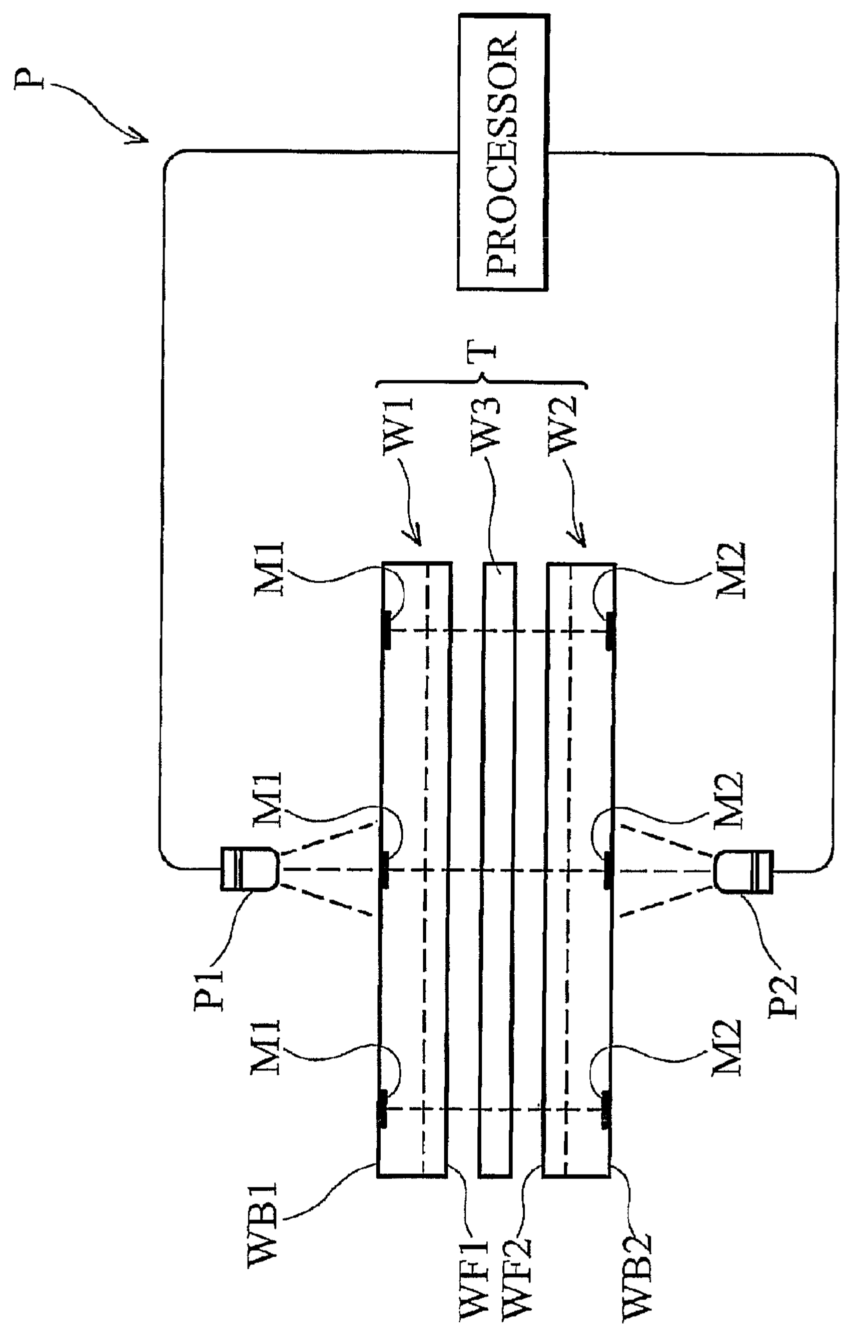
FIG. 2B is a perspective diagram in an embodiment of a dummy silicon substrate disposed between the first and second IC device substrates.

Since the alignment patterns M1 and M2 are formed on the outside of the three dimensional IC device T, facing outward toward the optical detectors P1 and P2 in opposite directions, the optical detectors P1 and P2 can directly detect the alignment patterns M1 and M2 for precise alignment without obstruction, as shown in FIG. 2A. In some embodiments, a three dimensional IC device can also be constructed by bonding more than two semiconductor wafers or thin semiconductor substrates, as shown in FIG. 2B, wherein a dummy silicon substrate W3 is inserted between the IC device substrates W1 and W2.

Figure 3:
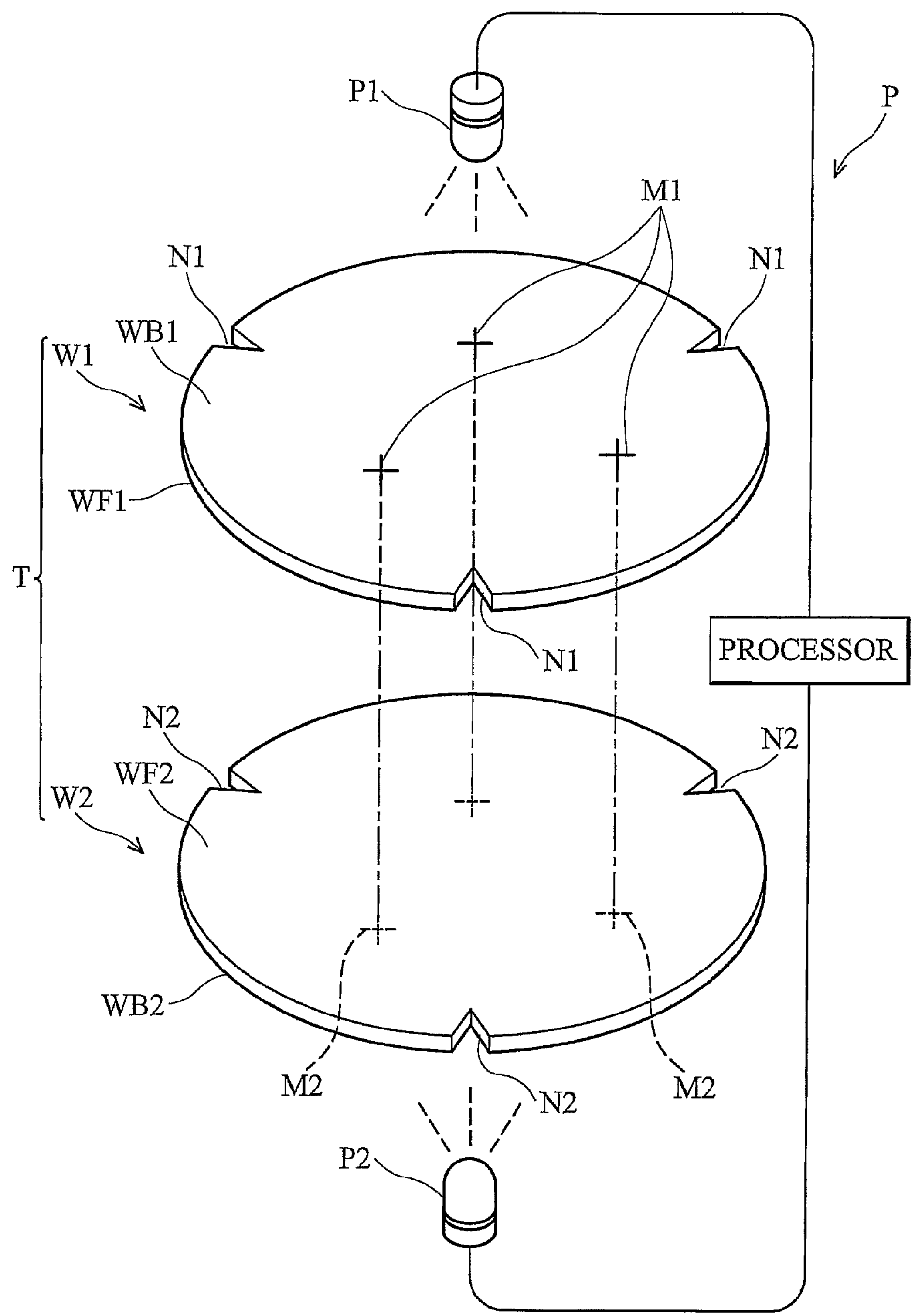
FIG. 3 is a perspective diagram in an embodiment of a three dimensional IC device with alignment notches.

Auxiliary alignment structures can be applied to the first and second IC device substrates W1 and W2 thereby facilitating precise alignment. As shown in FIG. 3, several notches N1 and N2 are correspondingly formed at the periphery of the first and second IC device substrates W1 and W2. The optical detector system P can output an adjustment signal by detecting not only the alignment patterns M1 and M2, but also the notches N1 and N2 from the first and second backsides WB1 and WB2 of the first and second IC device substrates W1 and W2, respectively. According to the adjustment signal, the positions of the first and second IC device substrates W1 and W2 can be appropriately aligned by aligning the alignment patterns M1, M2 and the notches N1 and N2.

Figure 4:
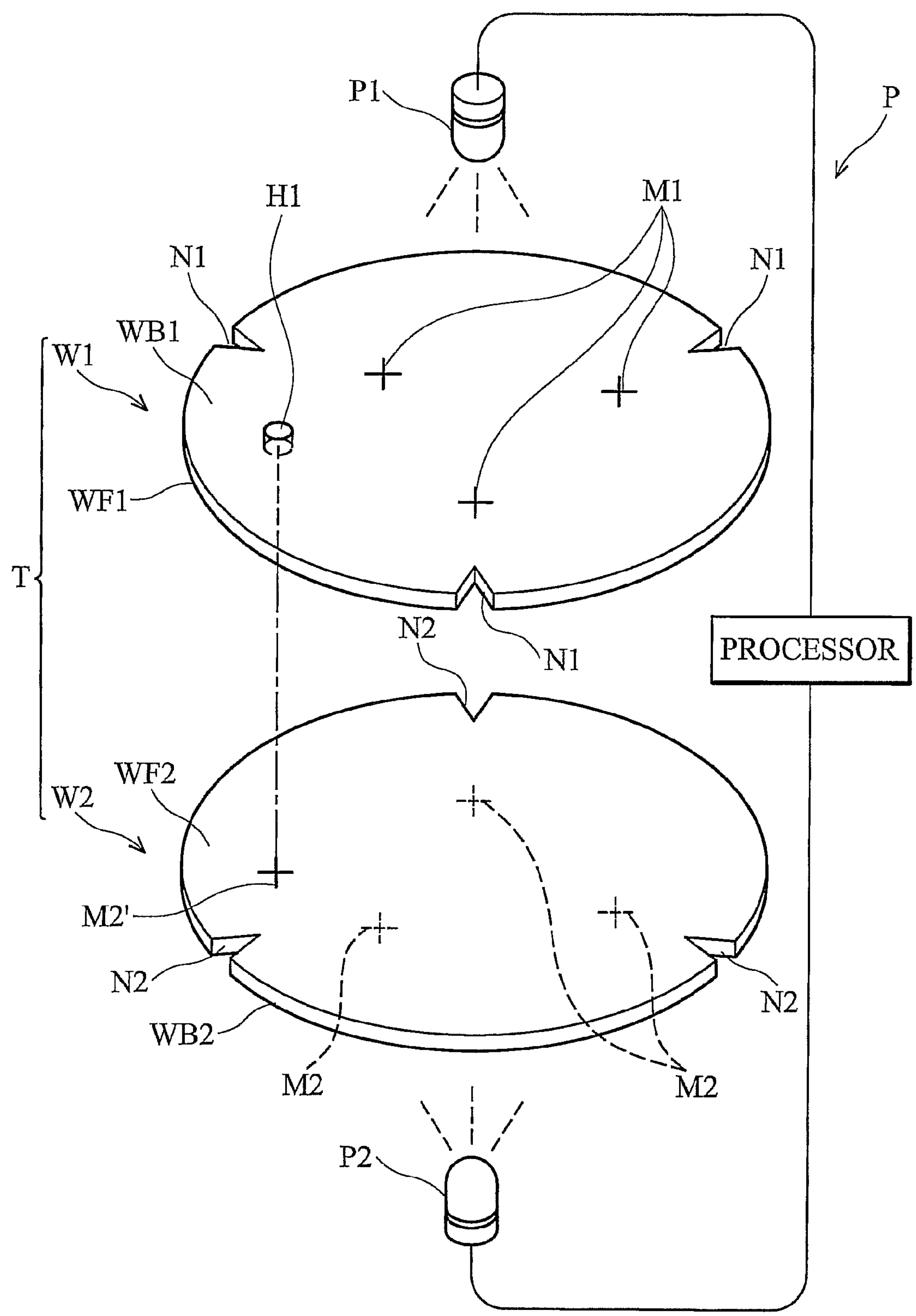
FIG. 4 is a perspective diagram in an embodiment of a three dimensional IC device with a through hole on the first IC device substrate.

In some embodiments, as shown in FIG. 4, the second IC device substrate W2 comprises several alignment patterns M2 on the second backsides WB2 and an inner alignment pattern M2' on the second front side WF2 facing the first IC device substrate W1. To detect the inner alignment patterns M2', a through hole H1, such as a laser drilled hole, is correspondingly disposed on the first IC device substrate W1. Hence, the optical detector P1 can directly detect the inner alignment patterns M2' through the hole H1 without obstruction. In FIG. 4, the notches N1, the alignment patterns M1 on the first backside WB1 and the inner alignment pattern M2' on the second front side WF2 are detected by the first detector P1, and the notches N2 and the alignment patterns M2 on the second backside WB2 are detected by the second detector P2, respectively. The optical detector system P can output an adjustment signal by detecting not only the alignment patterns M1, M2 and M2' but also the notches N1 and N2. According to the adjustment signal, the positions of the first and second IC device substrates W1 and W2 can be appropriately aligned.

Figure 5:
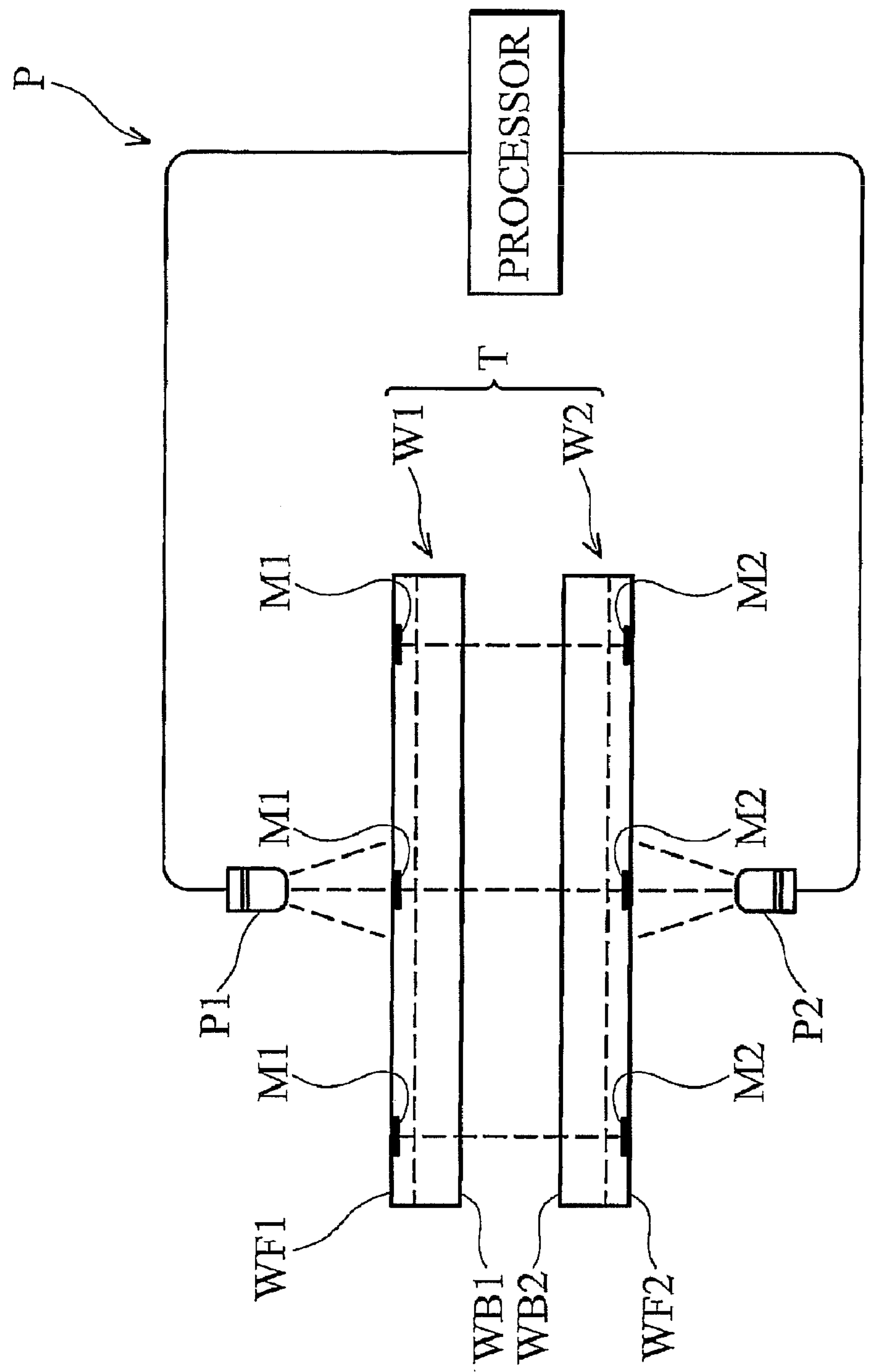
FIG. 5 is a perspective diagram in an embodiment of a three dimensional IC device with alignment patterns.

In some embodiments of three dimensional IC device fabrications, the first and second IC device substrates W1 and W2 are bonded back to back as shown in FIG. 5. To facilitate precise alignment, the alignment patterns M1 are formed on the first front side WF1 of the first IC device substrates W1, and correspondingly, the alignment patterns M2 are formed on the second front side WF2 of the second IC device substrates W2 for alignment. Since the alignment patterns M1 and M2 are formed on the outside of the three dimensional IC device T, facing outward toward the optical detectors P1 and P2 respectively, the optical detectors P1 and P2 can directly detect the alignment patterns M1 and M2 from the first front side WF1 and the second front side WF2 without obstruction.

Figure 6:
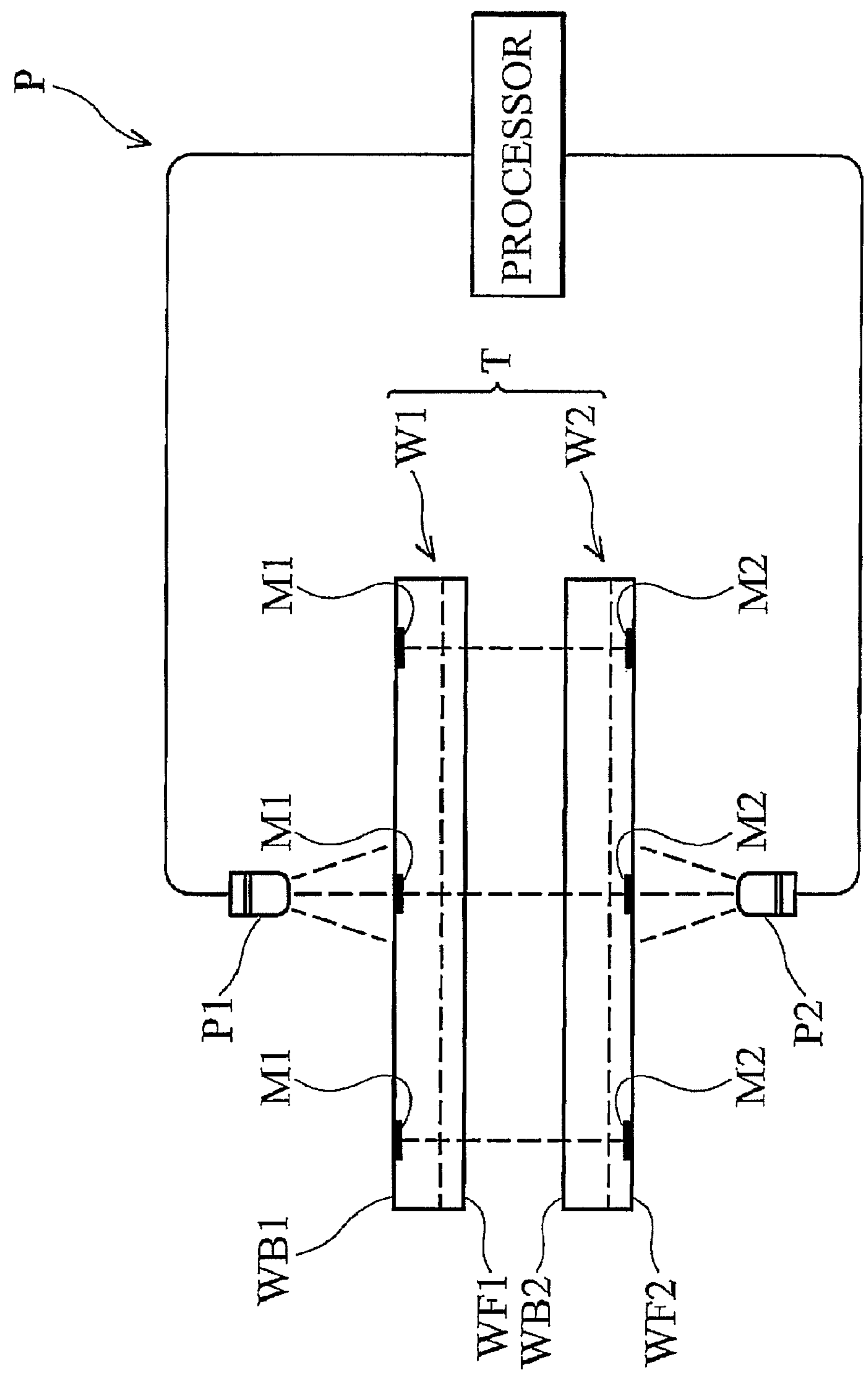
FIG. 6 is a perspective diagram in an embodiment of a three dimensional IC device with alignment patterns.

In some embodiments, as shown in FIG. 6, the first front side WF1 of the first IC device substrate W1 is bonded to the second backside WB2 of the second IC device substrate W2 for three dimensional IC device fabrications. Specifically, the first alignment patterns M1 are formed on the first backside WB1 of the first IC device substrate W1, and correspondingly, the second alignment patterns M2 are formed on the second front side WF2 of the second IC device substrate W2. Since the alignment patterns M1 and M2 are disposed on the outside of the three dimensional IC device T, facing outward toward the optical detectors P1 and P2 respectively, the optical detectors P1 and P2 can directly detect the alignment patterns M1 and M2 without obstruction.

Since the alignment patterns are formed on the backsides of the IC device substrates, available areas for IC features on the front sides increase. Moreover, as the alignment patterns M1 and M2 are formed on the outside of the three dimensional IC device T, facing outward toward the optical detectors P1 and P2 respectively, the optical detectors P1 and P2 can directly detect the alignment patterns M1 and M2 for precise alignment without obstruction.

Instead of utilizing a conventional IR apparatus, visible light can be employed by the optical detector system P to directly detect the alignment patterns, thereby increasing the alignment accuracy and simplifying the bonding process. In some embodiments, the IC device substrates such as semiconductor wafers, may comprise alignment patterns on both the front side and the backside for precise alignment during the bonding process. In some embodiments, detection of alignment patterns, notches or laser drilled holes can be widely applied in two or more wafers bonding processes for three dimensional IC fabrication.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A three dimensional IC device with alignment structure, comprising:

a first IC device substrate, comprising a first front side for defining a plurality of first IC features, a first backside opposite the first front side, and a first alignment pattern formed on the first backside; and a second IC device substrate bonded to the first IC device substrate, comprising a second front side for defining a plurality of second IC features, a second backside opposite the second front side, and a second alignment pattern formed on the second backside;

wherein, the first and second alignment patterns face outward with respect to the three dimensional IC device for alignment, wherein the second IC device substrate further comprises an inner alignment pattern formed on the second front side and facing the first IC device substrate, and the first IC device substrate further comprises an empty through hole corresponding to the inner alignment pattern for optical detection.

2. The three dimensional IC device of claim 1, wherein the first front side of the first IC device substrate faces the second front side of the second IC device substrate.

3. The three dimensional IC device of claim 1, wherein the through hole is a laser drilled hole.

4. The three dimensional IC device of claim 1, wherein the first IC device substrate further comprises a first alignment notch at the periphery thereof, and correspondingly, the second IC device substrate further comprises a second alignment notch at the periphery thereof aligned with the first alignment notch.

5. The three dimensional IC device of claim 1 further comprises a third IC device substrate bonded to the second IC device substrate.

6. The three dimensional IC device of claim 1 further comprising a dummy substrate disposed between the first and second IC device substrates.

7. The three dimensional IC device of claim 1, wherein the first IC device substrate comprises a plurality of first alignment patterns, and correspondingly, the second IC device substrate comprises a plurality of second alignment patterns.

8. The three dimensional IC device of claim 1, wherein the first IC device substrate comprises a semiconductor substrate.

9. The three dimensional IC device of claim 1, wherein the empty through hole is separated from the first alignment pattern.

* * * * *